United States Patent
Nega et al.

(10) Patent No.: US 9,667,147 B2
(45) Date of Patent: May 30, 2017

(54) SEMICONDUCTOR DEVICE WITH DC/DC CONVERTER CIRCUIT

(71) Applicant: Renesas Electronics Corporation, Tokyo (JP)

(72) Inventors: Ryohei Nega, Tokyo (JP); Yoshinao Miura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/065,762

(22) Filed: Mar. 9, 2016

(65) Prior Publication Data

US 2016/0190930 A1    Jun. 30, 2016

Related U.S. Application Data

(63) Continuation of application No. 14/060,601, filed on Oct. 22, 2013, now Pat. No. 9,324,851.

(30) Foreign Application Priority Data

Oct. 23, 2012   (JP) .................................. 2012-233481

(51) Int. Cl.
*H01L 23/495* (2006.01)
*H02M 3/158* (2006.01)
(Continued)

(52) U.S. Cl.
CPC ........ *H02M 3/158* (2013.01); *H01L 21/8252* (2013.01); *H01L 23/49562* (2013.01); *H01L 23/49844* (2013.01); *H01L 27/0605* (2013.01); *H01L 27/088* (2013.01); *H01L 27/0883* (2013.01); *H01L 29/205* (2013.01);
(Continued)

(58) Field of Classification Search
CPC ......... H01L 29/49575; H01L 23/49861; H01L 27/0883; H01L 29/41775
See application file for complete search history.

(56) References Cited

U.S. PATENT DOCUMENTS 6,188,130 B1   2/2001   Ramirez et al.
6,888,336 B2   5/2005   Kuehner et al.
(Continued)

FOREIGN PATENT DOCUMENTS

JP    2001-024112 A    1/2001
JP    2005-525777 A    8/2005
(Continued)

OTHER PUBLICATIONS

Office Action, issued Apr. 26, 2016, in Japanese Patent Application No. 2012-233481.
(Continued)

*Primary Examiner* — Thanh V Pham
(74) *Attorney, Agent, or Firm* — Shapiro, Gabor and Rosenberger, PLLC

(57) ABSTRACT

Provided is a semiconductor device including: a DC/DC converter circuit, wherein the DC/DC converter circuit includes a transistor of a normally-off type, having a first drain electrode connected town input terminal and a first source electrode connected to an output terminal, which is formed in a first compound semiconductor substrate having a two-dimensional electron gas layer, and a transistor having a second drain electrode connected to the first source electrode and a grounded second source electrode.

6 Claims, 13 Drawing Sheets

(51) Int. Cl.

| | | |
|---|---|---|
| *H01L 29/778* | (2006.01) | |
| *H01L 27/088* | (2006.01) | |
| *H02M 1/34* | (2007.01) | |
| *H01L 29/417* | (2006.01) | |
| *H01L 29/423* | (2006.01) | |
| *H01L 21/8252* | (2006.01) | |
| *H01L 27/06* | (2006.01) | |
| *H01L 29/205* | (2006.01) | |
| *H01L 29/20* | (2006.01) | |
| *H01L 23/498* | (2006.01) | |

(52) U.S. Cl.
CPC .. *H01L 29/41758* (2013.01); *H01L 29/42364* (2013.01); *H01L 29/7786* (2013.01); *H01L 29/7787* (2013.01); *H02M 1/34* (2013.01); *H01L 23/49575* (2013.01); *H01L 23/49861* (2013.01); *H01L 29/2003* (2013.01); *H01L 2224/48091* (2013.01); *H01L 2224/48247* (2013.01); *H01L 2224/49111* (2013.01)

(56) References Cited

U.S. PATENT DOCUMENTS

| | | | |
|---|---|---|---|
| 7,224,149 B2 | 5/2007 | Endo | |
| 7,863,877 B2 | 1/2011 | Briere | |
| 7,902,809 B2 | 3/2011 | Briere et al. | |
| 7,906,944 B2 | 3/2011 | McCune, Jr. | |
| 7,952,340 B2 | 5/2011 | Nilsson | |
| 8,148,964 B2 | 4/2012 | Briere | |
| 8,248,042 B2 | 8/2012 | Morita | |
| 8,476,885 B2 | 7/2013 | Briere | |
| 8,587,033 B1 | 11/2013 | Rieger et al. | |
| 8,716,141 B2 | 5/2014 | Dora et al. | |
| 9,142,659 B2 | 9/2015 | Dora et al. | |
| 2006/0175627 A1 | 8/2006 | Shiraishi | |
| 2011/0080156 A1 | 4/2011 | Briere et al. | |
| 2013/0342184 A1 | 12/2013 | Briere | |

FOREIGN PATENT DOCUMENTS

| | | |
|---|---|---|
| JP | 2006-223016 A | 8/2006 |
| JP | 2006-521081 A | 9/2006 |
| JP | 2008-187167 A | 8/2008 |
| JP | 2008-187885 A | 8/2008 |
| JP | 2008-306919 A | 12/2008 |
| JP | 2010-258150 A | 11/2010 |
| JP | 2011-009504 A | 1/2011 |
| JP | 2011-055006 A | 3/2011 |
| JP | 2011-160651 A | 8/2011 |
| WO | WO 2012/121952 A2 | 9/2012 |

OTHER PUBLICATIONS

Office Action, issued Nov. 1, 2016, in Japanese Application No. 2012-233481.

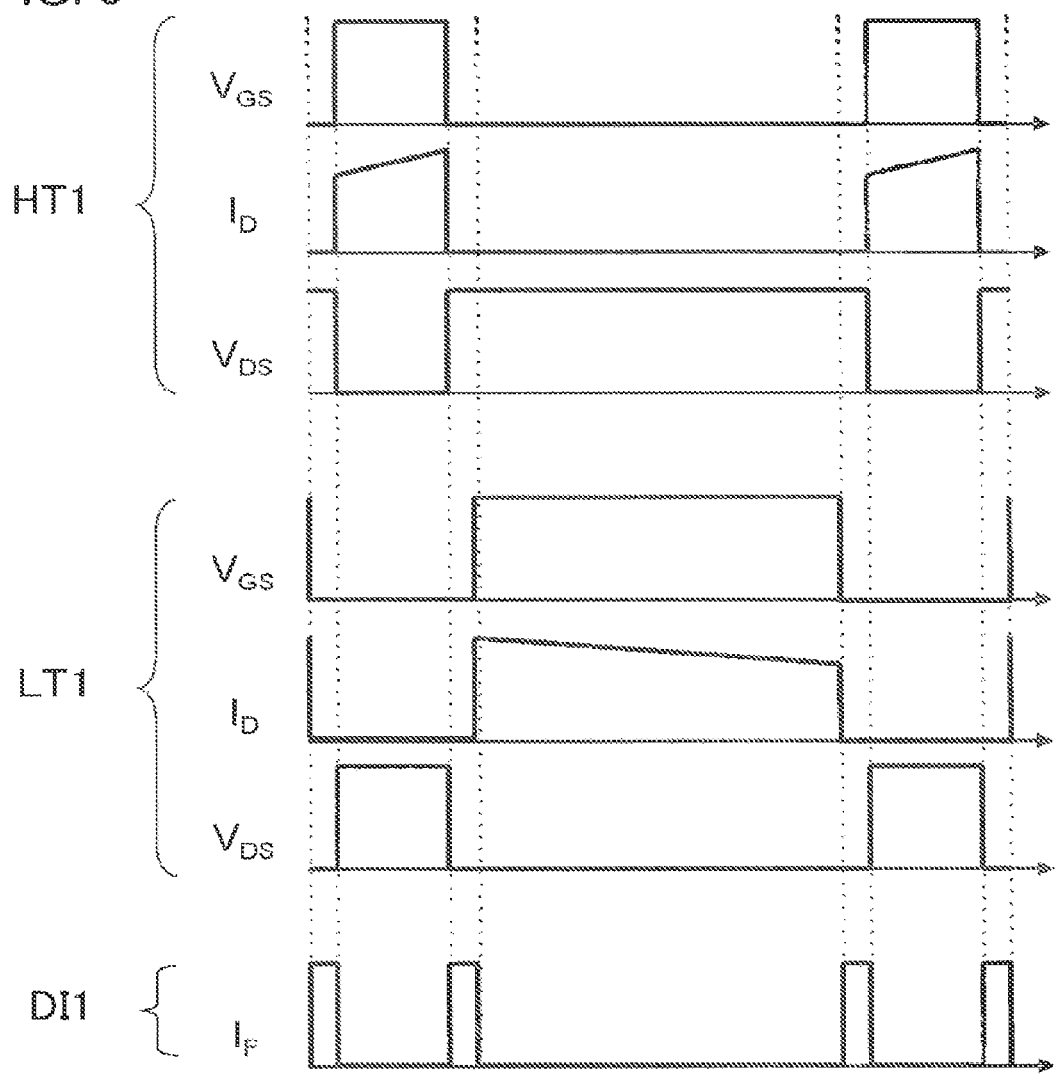

B-B'

SEMICONDUCTOR DEVICE WITH DC/DC CONVERTER CIRCUIT

This application is based on Japanese patent application No. 2012-233481, the content of which is incorporated hereinto by reference.

BACKGROUND

Technical Field

The invention relates to a semiconductor device, and relates to, for example, a technique applicable to a semiconductor device having a DC/DC converter circuit.

Related Art

Techniques regarding a DC/DC converter circuit have been variously examined, and include, for example, techniques disclosed in Japanese Unexamined Patent Publication No. 2011-160651, Japanese Unexamined Patent Publication No. 2006-223016, and PCT Japanese Translation Patent Publication No. 2006-521081.

The technique disclosed in Japanese Unexamined Patent Publication No. 2011-160651 relates to a buck converter circuit in which a control switch and a synchronous switch have a depletion-mode group III nitride switch. In addition, Japanese Unexamined Patent Publication No. 2011-160651 discloses the formation of a protection circuit which is configured so that a current does not flow through the control switch while a control circuit is not powered up.

Japanese Unexamined Patent Publication No. 2006-223016 discloses a non-isolated DC/DC converter in which a high-side switch is a gallium nitride element, PCT Japanese Translation Patent Publication No. 2006-521081 discloses a DC/DC converter including a non-silicon based switching transistor.

In addition, the technique disclosed in PCT Japanese Translation Patent Publication No. 2005-525777 relates to a technique in which a switching element incorporated in a low-side arm of an inverter is a normally-on switching element which allows electrical conduction when a control voltage is not applied.

In order to improve power source efficiency of a DC/DC converter circuit, a reduction in the loss of a switching device constituting the DC/DC converter circuit is required. In order to achieve the reduction in the loss of the switching device, for example, a transistor provided in a compound semiconductor substrate having a two-dimensional electron gas layer may be adopted as the switching device.

On the other hand, when a through-current flows into a circuit in a state where power is not completely supplied to the DC/DC converter circuit, there may be a concern of a transistor or the like constituting a circuit being damaged. However, as disclosed in, for example, Japanese Unexamined Patent Publication No. 2011-160651, when a protection circuit for suppressing such a through-current is newly formed, there may be a concern of a circuit being complicated.

Other problems and novel features will be made clearer from the description and the accompanying drawings of the present specification.

SUMMARY

In one embodiment, a first transistor constituting a DC/DC converter circuit is a normally-off type which is connected to an input terminal and is formed in a first compound semiconductor substrate having a two-dimensional electron gas layer.

According to the embodiment, it is possible to improve power source efficiency while achieving simplification of the DC/DC converter circuit.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a timing diagram illustrating operations of the semiconductor device according to the first embodiment.

DETAILED DESCRIPTION

Figure 1:
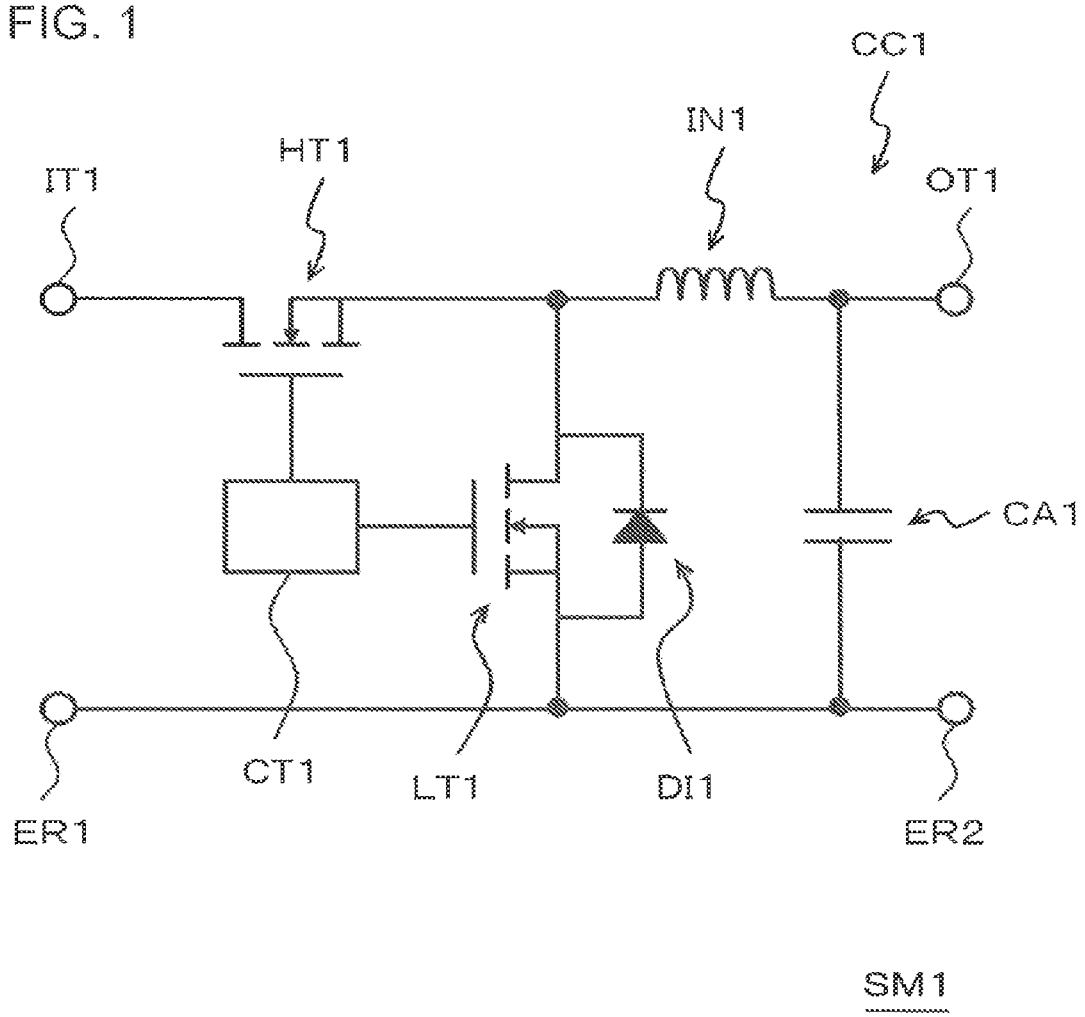
FIG. 1 is a circuit diagram illustrating a semiconductor device according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all the drawings, like elements are referenced by like reference numerals and descriptions thereof will not be repeated.

(First Embodiment)

Figure 2:
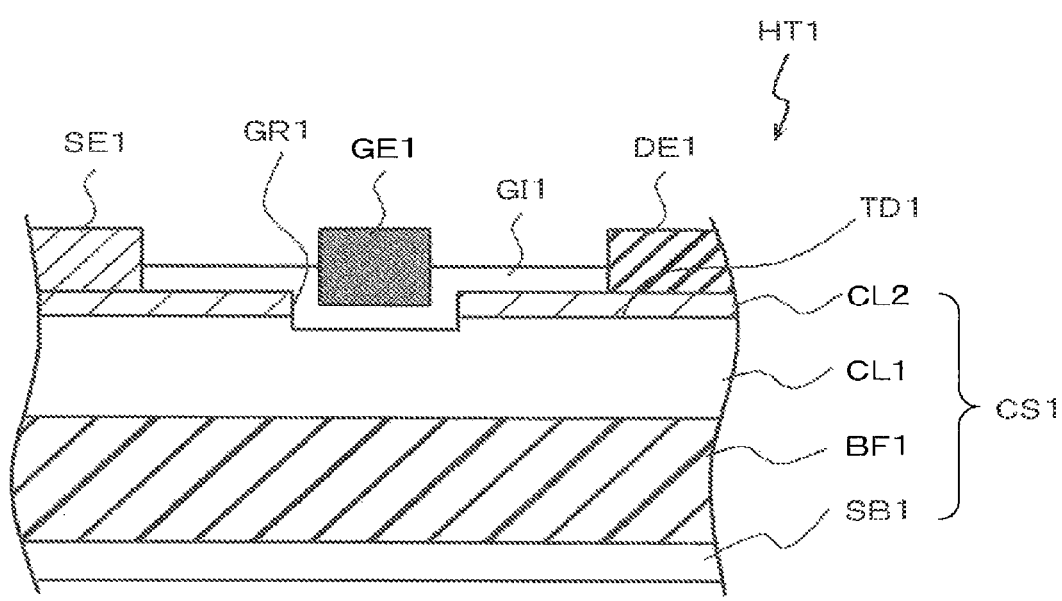
FIG. 2 is a cross-sectional view illustrating a configuration of a high-side transistor shown in FIG. 1.
Figure 3:
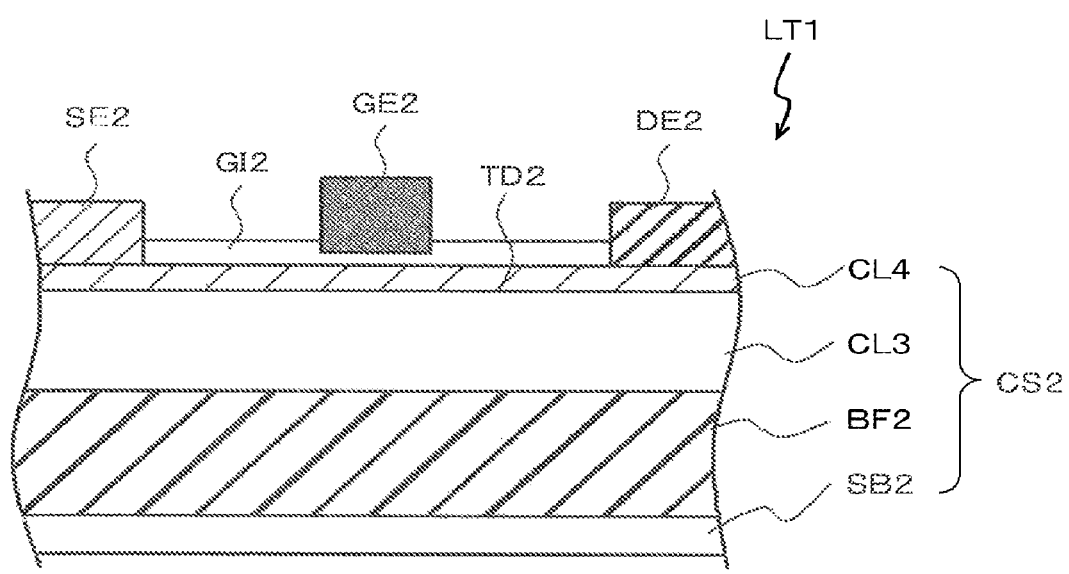
FIG. 3 is a cross-sectional view illustrating a configuration of a low-side transistor shown in FIG. 1.

FIG. 1 is a circuit diagram illustrating a semiconductor device SM1 according to a first embodiment, and particularly illustrates a configuration of a DC/DC converter circuit CC1 included in the semiconductor device SM1. FIG. 2 is a cross-sectional view illustrating a high-side transistor HT1 shown in FIG. 1. FIG. 3 is a cross-sectional view illustrating a configuration of a low-side transistor LT1 shown in FIG. 1.

The semiconductor device SM1 includes the DC/DC converter circuit CC1. The DC/DC converter circuit CC1 includes the transistor HT1 and the transistor LT1.

The transistor HT1 according to the present embodiment constitutes a high-side switching device in the DC/DC converter circuit CC1. For this reason, the transistor HT1 includes a drain electrode DE1 connected to an input terminal IT1, and a source electrode SE1 connected to an output terminal OT1.

In addition, the transistor HT1 is formed in a compound semiconductor substrate CS1 having a two-dimensional electron gas layer TD1. Further, the transistor HT1 is a normally-off type.

The transistor LT1 according to the present embodiment constitutes a low-side switching device in the DC/DC converter circuit CC1. For this reason, the transistor LT1 includes a drain electrode DE2 connected to the source electrode SE1 of the transistor HT1, and a grounded source electrode SE2.

According to such a configuration, the transistor HT1 is formed in the compound semiconductor substrate CS1 having the two-dimensional electron gas layer TD1, thereby allowing a switching device having a lower loss than a silicon device to be realized. For this reason, it is possible to achieve an improvement in the power source efficiency of the DC/DC converter circuit. In addition, the transistor HT1 connected to the input terminal is configured to be a normally-off type, thereby allowing flow of a through-current into a circuit in a state where power is not completely supplied to the DC/DC converter circuit to be suppressed, without newly providing a protection circuit. Therefore, it is possible to suppress complication of a circuit.

Therefore, according to the present embodiment, it is possible to improve power source efficiency while achieving the simplification of the DC/DC converter circuit.

Hereinafter, the configuration of the semiconductor device SM1 will be described in detail.

As shown in FIG. 1, the semiconductor device SM1 includes the DC/DC converter circuit CC1. The DC/DC converter circuit CC1 according to the present embodiment is constituted by the transistor HT1, the transistor LT1, a diode DI1, an inductor IN1, a capacitor CA1, and a control circuit CT1.

The DC/DC converter circuit CC1 constitutes, for example, a step-down buck converter.

The transistor HT1 constitutes a high-side switching device in the DC/DC converter circuit CC1. For this reason, the drain electrode DE1 of the transistor HT1 is connected to the input terminal IT1, and the source electrode SE1 is connected to the output terminal OT1 through the inductor IN1.

In the semiconductor device SM1, a protection circuit for suppressing the flow of a through-current into a circuit is not provided between the transistor HT1 and the input terminal IT1. For this reason, it is possible to suppress the complication of a circuit.

The transistor LT1 constitutes a low-side switching device in the DC/DC converter circuit CC1. For this reason, the drain electrode DE2 of the transistor LT1 is connected to the source electrode SE1 of the transistor HT1, and the source electrode SE2 is grounded. In the present embodiment, the drain electrode DE2 is connected to a path for connecting the transistor HT1 to the inductor IN1. In addition, the source electrode SE2 is connected to ground points ER1 and ER2.

The diode DI1 is connected in parallel with the transistor LT1. An anode of the diode DI1 is connected to the ground points ER1 and ER2, and a cathode thereof is connected to the transistor HT1 and the inductor IN1.

The inductor IN1 is configured such that one end thereof is connected to the transistor HT1, and the other end on the side opposite to the one end is connected to the output terminal OT1. The capacitor CA1 is configured such that one end thereof is connected to the inductor IN1 and the output terminal OT1, and the other end on the side opposite to the one end is grounded. The waveform of an output voltage is smoothed by the inductor IN1 and the capacitor CA1.

The control circuit CT1 is connected to a gate electrode GE1 of the transistor HT1 and a gate electrode GE2 of the transistor LT1. Thereby, the turn-on and turn-off of the transistor HT1 and the transistor LT1 constituting a switching device are controlled. In DC/DC converter circuit CC1, it is possible to constantly maintain an output voltage by switching an input voltage, and controlling a time ratio (duty ratio) between turn-on and turn-off.

The control circuit CT1 is constituted by, for example, a silicon transistor in which an impurity diffusion layer serving as a source and drain region is formed in a silicon substrate. The transistor constituting the control circuit CT1 is configured to be a silicon device, thereby allowing manufacturing costs of the DC/DC converter circuit CC1 including the control circuit CT1 to be reduced.

As shown in FIG. 2, the transistor HT1 is formed in the compound semiconductor substrate CS1 having the two-dimensional electron gas layer TD1. In addition, the transistor HT1 is a normally-off type transistor.

In the present embodiment, the compound semiconductor substrate CS1 is constituted by a support substrate SB1, a buffer layer BF1, a compound semiconductor layer CL1, and a compound semiconductor layer CL2.

The support substrate SB1 is formed of, for example, Si, SiC, GaN, or sapphire. The buffer layer BF1 is provided on the support substrate SB1. The buffer layer BF1 in the present embodiment is, for example, an insulating layer in which AlN and GaN are laminated in a multistage manner by a metalorganic vapor phase epitaxy (MOVPE) method. The thickness of the buffer layer BF1 is, for example, 1 μm.

The compound semiconductor layer CL1 is provided on the buffer layer BF1. The compound semiconductor layer CL1 is, for example, a GaN layer. The thickness of the compound semiconductor layer CL1 is, for example, 1 μm.

The compound semiconductor layer CL2 is provided on the compound semiconductor layer CL1. As the compound semiconductor layer CL2, a layer having a hetero interface being formed with respect to the compound semiconductor layer CL1 is selected. Thereby, the two-dimensional electron gas layer TD1 serving as a channel region of the transistor HT1 is formed on the interface between the compound semiconductor layer CL1 and the compound semiconductor layer CL2. In the present embodiment, the compound semiconductor layer CL2 is, for example, an AlGaN layer, and particularly preferably an $Al_{0.15}Ga_{0.85}N$ layer. The thickness of the compound semiconductor layer CL2 is, for example, 10 nm.

The transistor HT1 has a recess gate structure. That is, a gate recess GR1 which is a recess is formed on the surface of the compound semiconductor substrate CS1. At least a portion of the gate electrode GE1 is located within the gate recess GR1. Thereby, the electron concentration in a channel portion is selectively reduced, thereby allowing the transistor HT1 to be formed as a normally-off type transistor.

In the present embodiment, the gate recess GR1 is formed so as to pass through the compound semiconductor layer CL2. In addition, the gate recess GR1 may be formed so as to pass through the compound semiconductor layer CL2 and to embed a portion of the surface of the compound semiconductor layer CL1 therein. Further, the gate recess GR1 may be formed in the compound semiconductor layer CL2 so as not to pass through the compound semiconductor layer CL2.

The transistor HT1 includes a gate insulating film GI1 provided on the compound semiconductor layer CL2. The gate insulating film GI1 is formed on the compound semiconductor layer CL2, and on the inner wall of the gate recess GR1. For this reason, a recess is formed in a portion which overlaps the gate recess GR1 in the gate insulating film GI1 when seen in a plan view.

In the present embodiment, the gate insulating film GI1 is formed by, for example, a chemical vapor deposition (CVD) method. The gate insulating film GI1 is formed of, for example, $Al_2O_3$. The thickness of the gate insulating film GI1 is, for example, 10 nm.

Meanwhile, an opening is formed by etching in a portion of the gate insulating film GI1 in which the source electrode SE1 and the drain electrode DE1 are formed.

The transistor HT1 includes the gate electrode GE1 provided on the gate insulating film GI1. The gate electrode GE1 is formed at a position overlapping the gate recess GR1 when seen in a plan view. The gate electrode GE1 is, for example, a laminated structure in which Ni and Au are laminated in order.

The gate recess GR1 and the gate electrode GE1 are provided so as to be located between the source electrode SE1 and the drain electrode DE1.

The transistor HT1 includes the source electrode SE1 and the drain electrode DE1. The source electrode SE1 and the drain electrode DE1 is provided on the compound semiconductor layer CL2 so as to come into contact with the compound semiconductor layer CL2. In the present embodiment, the source electrode SE1 and the drain electrode DE1 are provided in the opening formed in the gate insulating film GI1, and thus the source electrode SE1 and the drain electrode DE1 come into contact with the compound semiconductor layer CL2.

The source electrode SE1 and the drain electrode DE1 are formed of, for example, one kind or two kinds or more kinds of metal materials selected from Ti, Al, Mo, and Au.

The gate length of the transistor HT1 is, for example, 0.5 µm. The distance between the gate electrode GE1 and the drain electrode DE1 is, for example, 0.5 µm. The distance between the gate electrode GE1 and the source electrode SE1 is, for example, 0.5 µm.

The threshold voltage of the transistor HT1 is, for example, 1.0 V. The strength voltage of the transistor HT1 is, for example, 40 V. The on-resistance of the transistor HT1 is, for example, 10 mΩ.

The transistor HT1 has, for example, a polyimide film (not shown) as a cover film that covers the gate electrode GE1, the source electrode SE1 and the drain electrode DE1. The polyimide film is formed on the gate insulating film GI1 so as to cover the gate electrode GE1, the source electrode SE1 and the drain electrode DE1. In addition, an interconnect is formed on the polyimide film. The interconnect is formed of, for example, Au.

The transistor HT1 having such a configuration is sealed in, for example, the package of TO220.

Figure 5A:
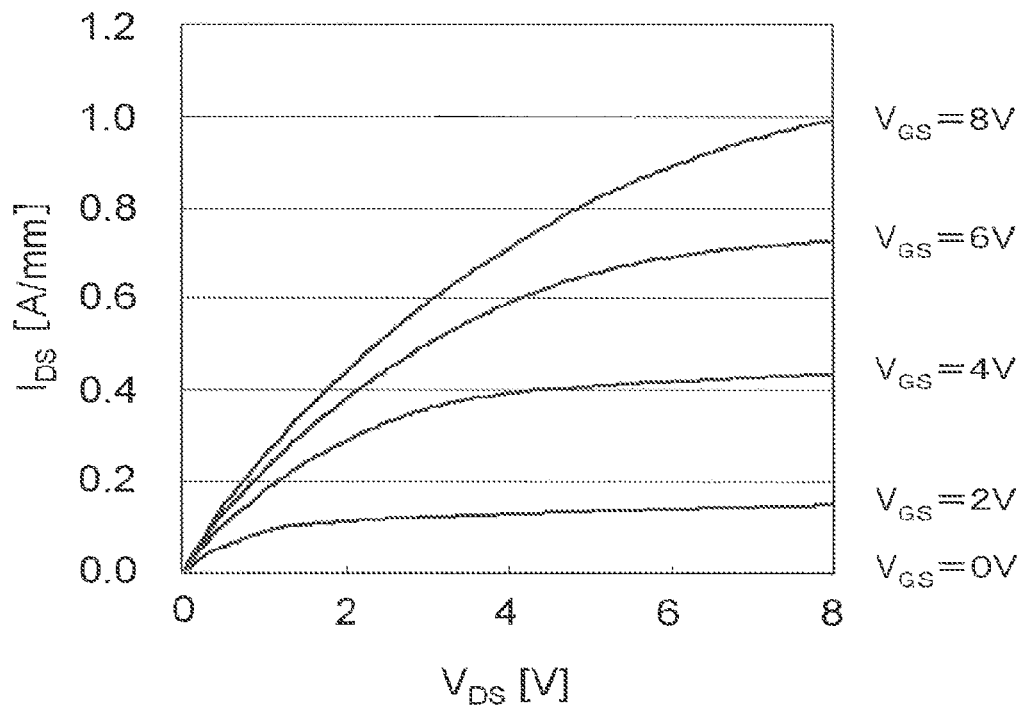
FIGS. 5A and 5B are graphs illustrating $I_{DS}$-$V_{DS}$ waveforms in a normally-off type transistor and a normally-on type transistor.
Figure 5B:
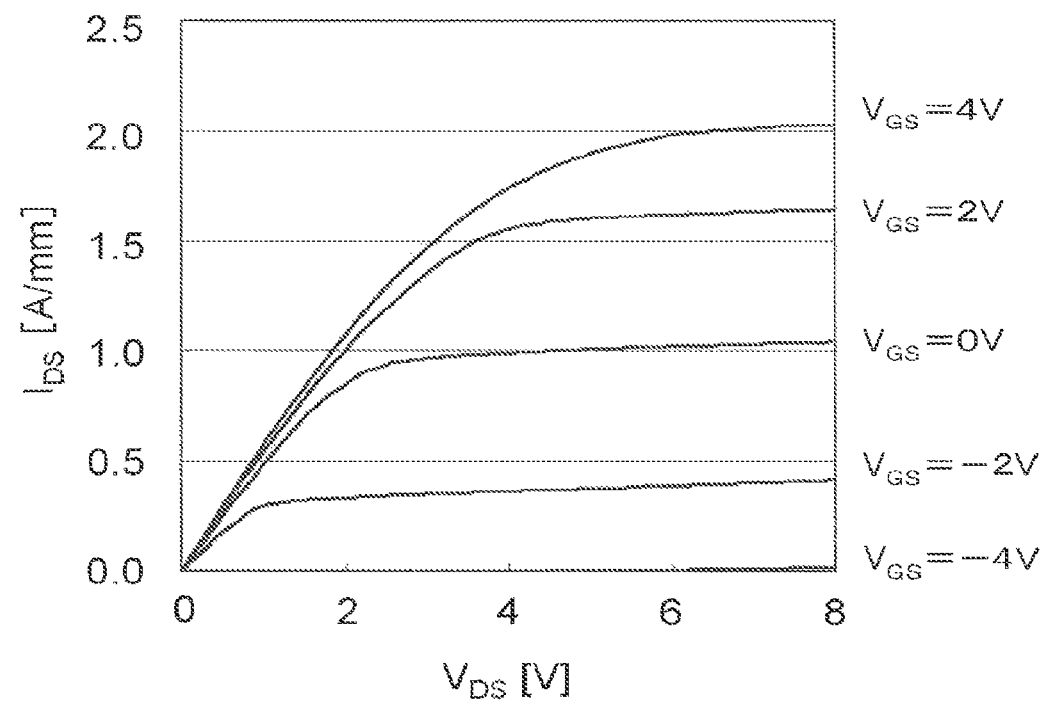

FIGS. 5A and 5B are graphs illustrating $I_{DS}$-$V_{DS}$ waveforms in a normally-off type transistor and a normally-on type transistor. FIG. 5A illustrates $I_{DS}$-$V_{DS}$ waveforms of the transistor HT1 which is a normally-off type transistor.

In FIG. 5A, $I_{DS}$-$V_{DS}$ waveforms in gate voltages $V_{GS}$ of 0 V, 2 V, 4 V, 6 V, and 8 V are shown. As shown in FIG. 5A, when the gate voltage $V_{GS}$ is 0 V without applying the gate voltage $V_{GS}$, an on-state current $I_{DS}$ does not flow. In addition, when the gate voltage $V_{GS}$ is applied, the on-state current $I_{DS}$ flows in the transistor HT1. In this manner, it is known that the transistor HT1 according to the present embodiment functions as a normally-off type transistor.

The transistor HT1 is, for example, formed as follows.

First, the compound semiconductor substrate CS1 is formed by laminating the buffer layer BF1, the compound semiconductor layer CL1, and the compound semiconductor layer CL2 in order on the support substrate SB1.

Next, the compound semiconductor layer CL2 is selectively removed by etching using a photoresist as a mask, and the gate recess GR1 is formed. Next, in order to eliminate damage in the etching process, wet etching is performed on the surface of the compound semiconductor substrate CS1 by an acid.

Next, the gate insulating film GI1 is formed on the compound semiconductor layer CL2 and on the inner wall of the gate recess GR1. The gate insulating film GI1 is formed by, for example, a CVD method. Next, the gate electrode GE1 is formed on the gate insulating film GI1 and at a position overlapping the gate recess GR1 when seen in a plan view.

Next, openings for burying the source electrode SE1 and the drain electrode DE1 are formed in the gate insulating film GI1 by etching using a photoresist as a mask. Next, the source electrode SE1 and the drain electrode DE1 are formed so as to bury the openings and to come into contact with the compound semiconductor layer CL2.

In this manner, the transistor HT1 is formed.

As shown in FIG. 3, the transistor LT1 according to the present embodiment is formed in a compound semiconductor substrate CS2 having a two-dimensional electron gas layer TD2. In addition, the transistor LT1 is a normally-on type transistor.

In the present embodiment, since the transistor LT1 is formed in the compound semiconductor substrate CS2 having a two-dimensional electron gas layer, it is possible to realize a switching device having a lower loss than a silicon device. In addition, the transistor LT1 is configured to be a normally-on type, thereby allowing the on-resistance of the transistor LT1 to be reduced. For this reason, a lower-loss switching device is realized. Therefore, with such a configuration according to the present embodiment, it is possible to further improve the power source efficiency of the DC/DC converter circuit.

Meanwhile, the transistor LT1 may be, for example, a silicon device having an impurity diffusion layer constituting a source and drain region and a channel region formed in a silicon substrate. The transistor LT1 is configured to be a silicon device, thereby allowing manufacturing costs of the transistor LT1 to be reduced. In addition, the transistor LT1 is configured to be a silicon device, thereby allowing formation of the DC/DC converter circuit CC1 to be facilitated.

In the present embodiment, the compound semiconductor substrate CS2 is constituted by a support substrate SB2, a buffer layer BF2, a compound semiconductor layer CL3, and a compound semiconductor layer CL4 The support substrate SB2, the buffer layer BF2, the compound semiconductor layer CL3, and the compound semiconductor layer CL4 have the same configurations as, for example, those of the support substrate SB1, the buffer layer BF1, the compound semiconductor layer CL1, and the compound semiconductor layer CL2, respectively.

The transistor LT1 has a planer gate structure. That is, a gate recess is not provided in the surface of the compound semiconductor substrate CS2. Thereby, the transistor LT1 can be configured to be a normally-on type transistor. In this case, it is possible to form a hetero-junction on the entire interface between the compound semiconductor layer CL3 and the compound semiconductor layer CL4, and to realize high electron density in a channel portion. Therefore, it is possible to reduce an on-resistance in the transistor LT1, and to achieve a reduction in the loss of a switching device.

In the present embodiment, a gate recess is not provided in the surface of the compound semiconductor substrate CS2. For this reason, a portion which overlaps the gate electrode GE2 in the compound semiconductor layer CL4 when seen in a plan view and other portions become equal to each other, for example, in film thickness.

The transistor LT1 includes a gate insulating film GI2 provided on the compound semiconductor layer CL4. The gate insulating film GI2 is formed on the compound semiconductor layer CL4. The gate insulating film GI2 has the same configuration as, for example, that of the gate insulating film GI1.

In addition, the transistor LT1 includes the gate electrode GE2 provided on the gate insulating film GI2. The gate electrode GE2 is provided so as to be located between the source electrode SE1 and the drain electrode DE1. The gate electrode GE2 has the same configuration as, for example, that of the gate electrode GE1. Meanwhile, in the present embodiment, a recess which does not pass through the gate insulating film GI2 may be formed in a portion of the gate insulating film GI2 in which the gate electrode GE2 is provided. In this case, the gate electrode GE2 is formed so as to bury the recess.

The transistor LT1 includes the source electrode SE2 and the drain electrode DE2. The source electrode SE2 and the drain electrode DE2 are provided on the compound semiconductor layer CL4 so as to come into contact with the compound semiconductor layer CL4. The source electrode SE2 and the drain electrode DE2 have the same configurations as, for example, those of the source electrode SE1 and the drain electrode DE1.

The gate length of the transistor LT1 is, for example, 0.5 µm. The distance between the gate electrode GE2 and the drain electrode DE2 is, for example, 0.5 µm.

The threshold voltage of the transistor LT1 is, for example, −4.0 V. The strength voltage of the transistor LT1 is, for example, 40 V. The on-resistance of the transistor LT1 is, for example, 1.2 mΩ. The transistor LT1 is configured to be a normally-on type transistor, thereby allowing the on-resistance of the transistor LT1 to be set to a low value as mentioned above. Thereby, it is possible to form a low-loss switching device.

The transistor LT1 includes, for example, a polyimide film (not shown) as a cover film that covers the gate electrode GE2, the source electrode SE2 and the drain electrode DE2. The polyimide film is formed on the gate insulating film GI2 so as to cover the gate electrode GE2, the source electrode SE2 and the drain electrode DE2. In addition, an interconnect is formed on the polyimide film. The interconnect is formed of, for example, Au.

The transistor LT1 such a configuration is sealed in, for example, the package of TO220.

FIG. 5B illustrates $I_{DS}$-$V_{DS}$ waveforms of the transistor LT1 which is a normally-on type transistor.

In FIG. 5B, $I_{DS}$-$V_{DS}$ waveforms in the gate voltage $V_{GS}$ of −4 V, −2 V, 0 V, 2 V, and 4 V are shown. As shown in FIG. 5B, when the gate voltage $V_{GS}$ is 0 V without applying the gate voltage $V_{GS}$, the on-state current $I_{DS}$ flows in the transistor LT1. In addition, when the gate voltage $V_{GS}$ is set to −4 V, the on-state current $I_{DS}$ can be caused not to flow. As stated above, it is known that the transistor LT1 according to the present embodiment functions as a normally-on type transistor.

In the present embodiment, for example, the gate voltage $V_{GS}$ of the transistor LT1 is set to 0 V when a low-side switching device is set to be in an off-state, and the gate voltage $V_{GS}$ of the transistor LT1 is set to 5 V when the device is set to be in an on-state. Thereby, it is possible to secure the operation reliability of the DC/DC converter circuit CC1 while sufficiently reducing an on-resistance in an on-state.

The transistor LT1 is, for example, formed as follows.

First, the compound semiconductor substrate CS2 is formed by laminating the buffer layer BF2, the compound semiconductor layer CL3, and the compound semiconductor layer CL4 in order on the support substrate SB2. Next, the gate insulating film GI2 is formed on the compound semiconductor layer CL4. The gate insulating film GI2 is formed by, for example, a CVD method. Next, the gate electrode GE2 is formed on the gate insulating film GI2. Next, openings for burying the source electrode SE2 and the drain electrode DE2 are formed in the gate insulating film GI2 by etching using a photoresist as a mask. Next, the source electrode SE2 and the drain electrode DE2 are formed so as to bury the openings and to come into contact with the compound semiconductor layer CL4 In this manner, the transistor LT1 is formed.

Figure 4:
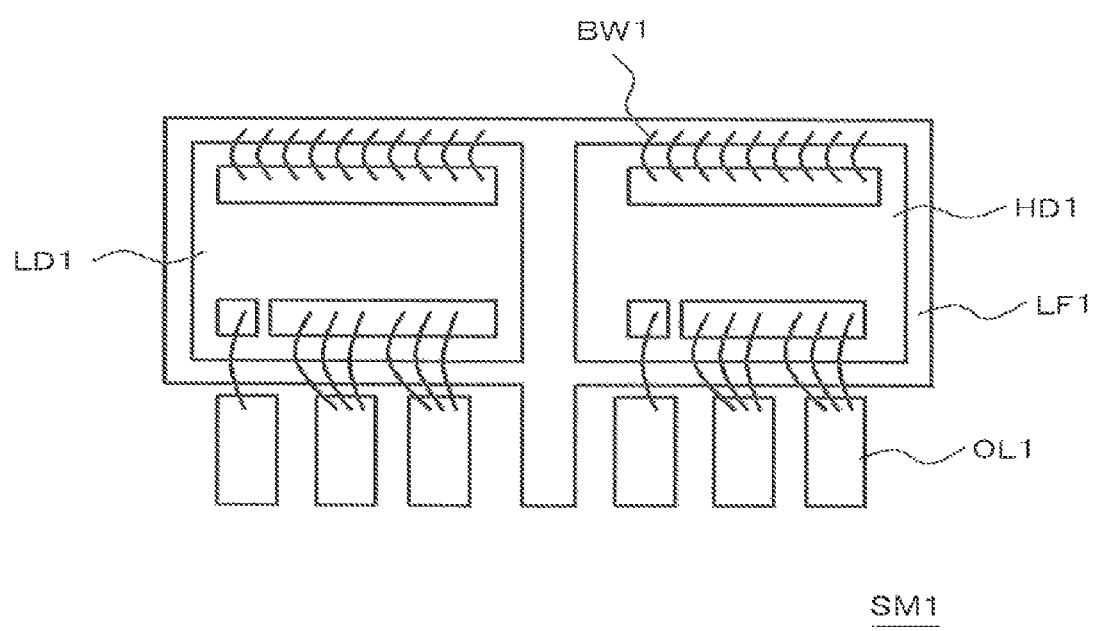
FIG. 4 is a plan view illustrating an example of the semiconductor device according to the first embodiment.

FIG. 4 is a plan view illustrating an example of the semiconductor device SM1 according to the present embodiment.

In the present embodiment, a high-side switching device HD1 constituted by the transistor HT1 and a low-side switching device LD1 constituted by the transistor LT1 can be mounted to the same semiconductor package. In this case, the high-side switching device HD1 is mounted onto one region of a lead frame LF1, and the low-side switching device LD1 is mounted onto the other region separated from the one region.

For example, the high-side switching device HD1 and the low-side switching device LD1 which are mounted onto the lead frame LF1 are sealed by a sealing resin or the like, and thus a semiconductor package is formed.

In this case, the transistor HT1 and the transistor LT1 constitute semiconductor chips different from each other.

The connection of each electrode to the lead frame LF1 or an outer lead OL1 is performed as follows using, for example, a bonding wire BW1.

In the transistor HT1 constituting the high-side switching device HD1, one of the source electrode SE1 and the drain electrode DE1 is connected to the lead frame LF1, and the other thereof is connected to the outer lead OL1. In addition, the gate electrode GE1 is connected to the outer lead OL1. In the transistor LT1 constituting the low-side switching device LD1, one of the source electrode SE2 and the drain electrode DE2 is connected to the lead frame LF1, and the other thereof is connected to the outer lead OL1. In addition, the gate electrode GE2 is connected to the outer lead OL1.

FIG. 6 is a timing diagram illustrating operations of the semiconductor device SM1 according to the present embodiment. In FIG. 6, a gate voltage $V_{GS}$, an on-state current $I_D$, and a drain voltage $V_{DS}$ in each of the transistor HT1 and the transistor LT1, and a current $I_F$ flowing in the diode DI1 are shown.

As shown in FIG. 6, in the DC/DC converter circuit CC1 according to the present embodiment, the on-time of the transistor LT1 can be made larger than the on-time of the transistor HT1. Meanwhile, the term "on-time" as used herein means a time for which, when a switching device constituted by a transistor is in an on-state, the on-state current $I_D$ flows in the transistor.

In addition, the transistor LT1, which is a normally-on type transistor, has a smaller loss due to an on-resistance than the transistor HT1, which is a normally-off type transistor, does.

For this reason, the transistor LT1 is configured to be a normally-on type, and the on-time of the transistor LT1 is made larger than the on-time of the transistor HT1, thereby allowing a reduction in the loss of a switching device to be achieved more efficiently.

Figure 7:
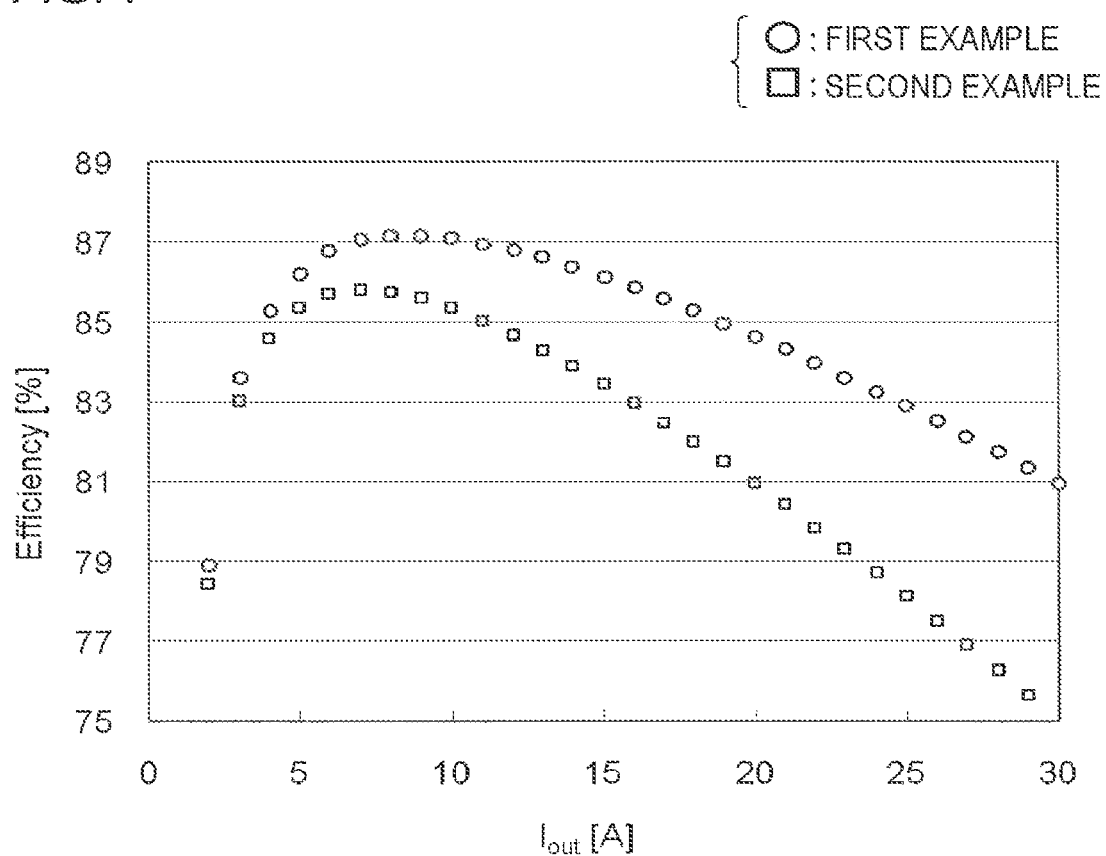
FIG. 7 is a graph illustrating the power conversion efficiency of a DC/DC converter circuit.

FIG. 7 is a graph illustrating the power conversion efficiency of the DC/DC converter circuit CC1.

FIG. 7 shows results obtained by actually measuring power conversion efficiency (%) when the DC/DC converter circuit is brought into operation as a frequency of 2 MHz, $V_{in}$=12V, and $V_{out}$=1.1 V. In FIG. 7, the power conversion efficiency (%) is shown as values to output currents $I_{out}$(A).

On the other hand, a first example will be shown in which a normally-off type transistor is used as the high-side transistor HT1, and a normally-on type transistor is used as the low-side transistor HT1. On the other hand, a second example will be shown in which a normally-off type transistor is used in both the high-side transistor HT1 and the low-side transistor HT1. Here, a transistor having a structure shown in FIG. 2 is used as a normally-off type transistor, and a transistor having a structure shown in FIG. 3 is used as a normally-on type transistor.

As shown in FIG. 7, in the first example, it is known that an efficiency of approximately 1.5% is improved at the time of a peak, compared to the second example. In addition, in the first example, it is known that an efficiency of approximately 6% is improved when $I_{out}$=30 A, compared to the second example.

In this manner, it is known that the transistor HT1 is configured to be a normally-off type, and the transistor LT1 is configured to be a normally-on type, thereby allowing a further reduction in the loss of a switching device to be achieved while avoiding the complication of a circuit.

Next, an effect of the present embodiment will be described.

According to the present embodiment, the transistor HT1 constituting the DC/DC converter circuit CC1 is a normally-off type which is connected to the input terminal IT1 and is formed in the compound semiconductor substrate CS1 having the two-dimensional electron gas layer TD1. The transistor HT1 is formed in the compound semiconductor substrate CS1 having the two-dimensional electron gas layer TD1, thereby allowing a switching device having a lower loss than a silicon device does to be realized. Therefore, it is possible to achieve an improvement in the power source efficiency of the DC/DC converter circuit. In addition, the transistor HT1 connected to the input terminal is configured to be a normally-off type, and thus it is possible to suppress the flow of a through-current into a circuit in a state where power is not completely supplied to the DC/DC converter circuit, with out providing a protection circuit newly. Therefore, it is possible to suppress the complication of a circuit.

Therefore, it is possible to improve power source efficiency while achieving the simplification of the DC/DC converter circuit.

(Second Embodiment)

Figure 8:
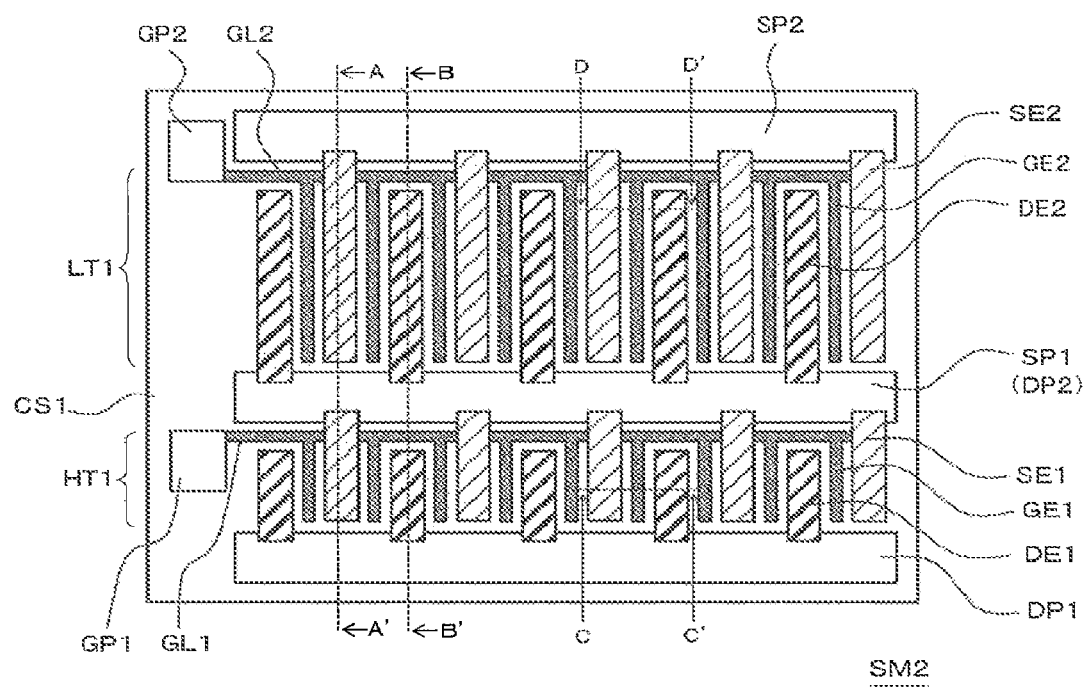
FIG. 8 is a plan view illustrating a semiconductor device according to a second embodiment.

FIG. 8 is a plan view illustrating a semiconductor device SM2 according to a second embodiment. FIG. 8 shows a positional relationship between the gate electrode GE1, the gate electrode GE2, the source electrode SE1, the source electrode SE2, the drain electrode DE1, and the drain electrode DE2. Meanwhile the positional relationship therebetween is not limited to those shown in FIG. 8.

Figure 9A:
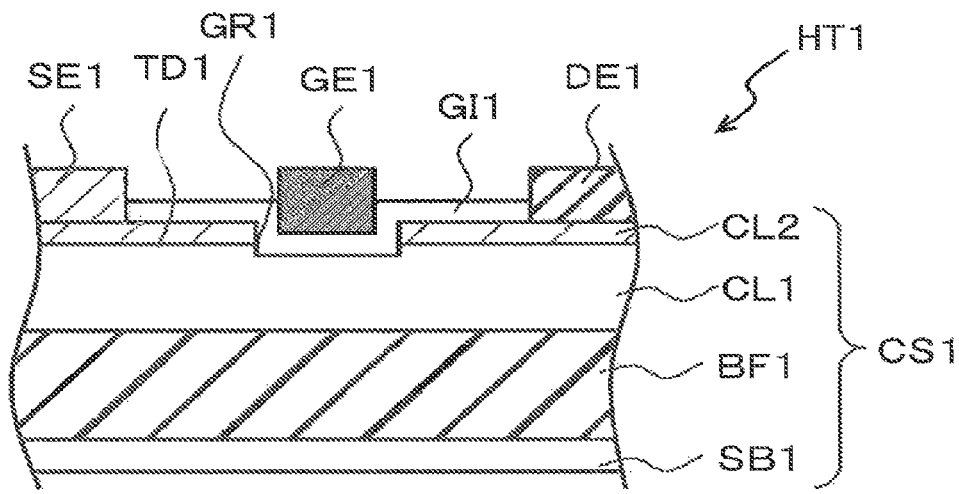
FIGS. 9A and 9B are cross-sectional views illustrating the semiconductor device shown in FIG. 8.
Figure 9B:
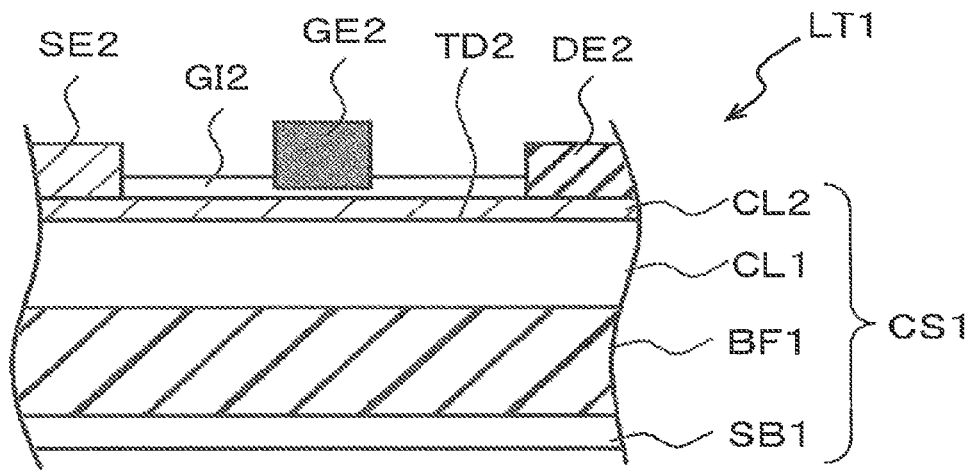

FIGS. 9A and 9B are cross-sectional views illustrating the semiconductor device SM2 shown in FIG. 8. FIG. 9A shows cross-section C-C' of FIG. 8. In addition, FIG. 9B shows cross-section D-D' of FIG. 8.

In the semiconductor device SM2 according to the present embodiment, the transistor HT1 and the transistor LT1 are provided in the same compound semiconductor substrate CS1.

As shown in FIG. 8 and FIGS. 9A and 9B, the transistor HT1 and the transistor LT1 are all provided in the compound semiconductor substrate CS1. Except for this point, the configurations of the transistor HT1 and the transistor LT1 in the present embodiment can be configured to be the same as those in the first embodiment.

Figure 10:
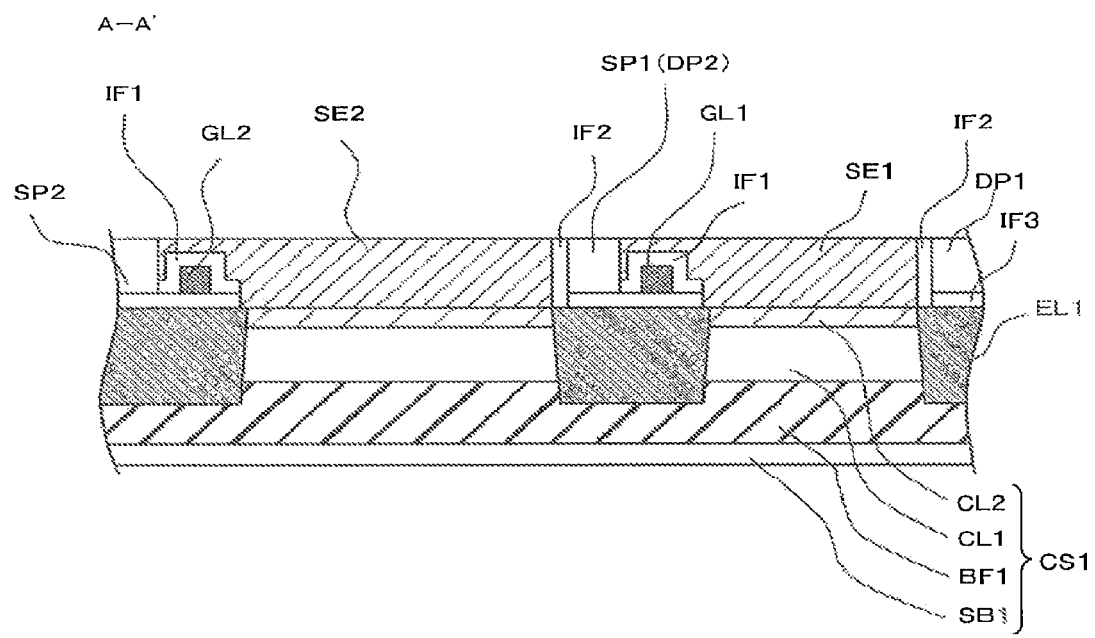
FIG. 10 is a cross-sectional view taken along line A-A' of FIG. 8.
Figure 11:
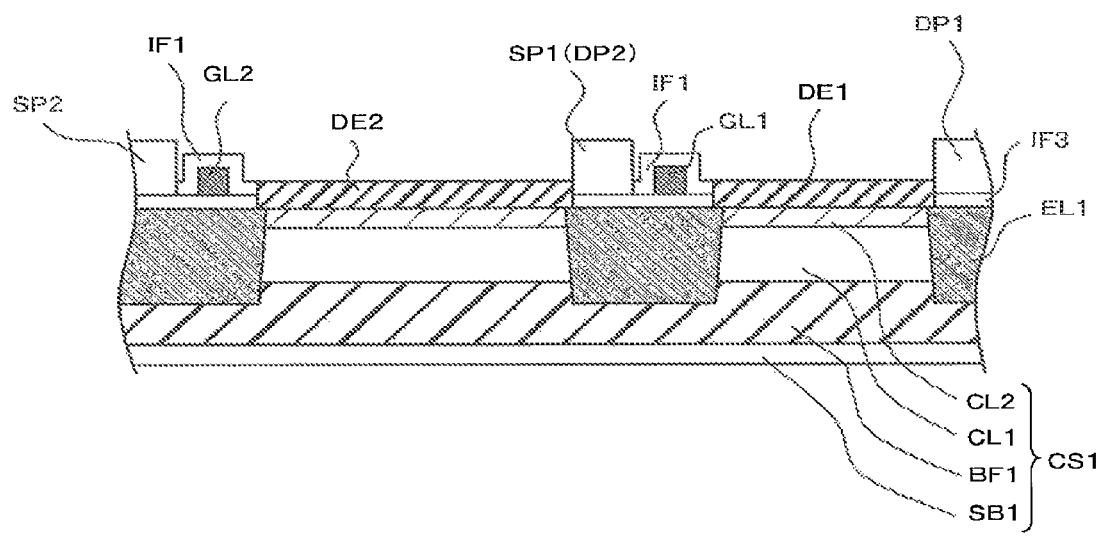
FIG. 11 is a cross-sectional view taken along line B-B' of FIG. 8.

FIG. 10 is a cross-sectional view taken along line A-A' of FIG. 8. FIG. 11 is a cross-sectional view taken along line B-B' of FIG. 8.

As shown in FIGS. 10 and 11, an element isolation film EL1 is formed in the compound semiconductor substrate CS1. The transistor HT1 and the transistor LT1 are respectively electrically isolated from other transistors by the element isolation film EL1. In the present embodiment, the transistor HT1 and the transistor LT1 are electrically isolated from each other by the element isolation film EL1. The element isolation film EL1 is formed, for example, so as to pass through the compound semiconductor layer CL2 and the compound semiconductor layer CL1 and to reach the buffer layer BF1. In addition, the element isolation film EL1 is formed by performing, for example, ion implantation of boron into the compound semiconductor substrate CS1. This ion implantation is performed, for example, under the conditions of an implantation energy of 120 keV and a dose amount of $2\times10^{14}$ cm$^{-2}$.

The transistor HT1 and the transistor LT1 according to the present embodiment are, for example, formed as follows.

First, as is the case with the first embodiment, the compound semiconductor substrate CS1 is formed. Next, the compound semiconductor layer CL2 is selectively removed by etching using a photoresist as a mask, and the gate recess GR1 is formed. Next, boron is ion-implanted into the compound semiconductor substrate CS1, and the element isolation film EL1 is formed. Next, the gate insulating film GI1 and gate insulating film GI2 are formed on the compound semiconductor layer CL2 and on the inner wall of the gate recess GR1. The gate insulating film GI1 and the gate insulating film GI2 are formed integrally with each other by the same process. Next, a conductive film formed on the gate insulating film GI1 and the gate insulating film GI2 is patterned, and the gate electrode GE1 and the gate electrode GE2 are formed. At this time, the gate electrode GE1 is formed at a position overlapping the gate recess GR1 when seen in a plan view, and the gate electrode GE2 is formed at position separated from the gate electrode GE1.

Next, openings for burying the source electrode SE1 and the drain electrode DE1 are formed in the gate insulating film GI1 and openings for burying the source electrode SE2 and the drain electrode DE2 are formed in the gate insulating film GI2 by etching using a photoresist as a mask. Next, the source electrode SE1, the drain electrode DE1, the source electrode SE2, and the drain electrode DE2 are formed so as to bury these openings and to come into contact with the compound semiconductor layer CL2.

In the present embodiment, as mentioned above, each configuration of the transistor HT1 and the transistor LT1 can be formed by a common process. For this reason, it is possible to achieve a reduction in a number of manufacturing processes.

As shown in FIG. 8, the semiconductor device SM2 includes a plurality of gate electrodes GE1. Each of the gate electrodes GE1 extends in a first direction. In addition, each of the gate electrodes GE1 is arranged so as to be separated from each other in a second direction perpendicular to the first direction in the plane surface of the compound semiconductor substrate CS1 One end of each gate electrode GE1 is connected to the gate interconnect GL1 extending in the second direction. For this reason, the plurality of gate electrodes GE1 and the gate interconnect GL1 form a comb-teeth shape. One end of the gate interconnect GL1 is connected to a gate pad GP1. Each of the gate electrodes GE1 is connected to the control circuit CT1 through the gate pad GP1. Here, the first direction denotes a vertical direction in FIGS. 9A and 9B, and the second direction denotes a horizontal direction in FIGS. 9A and 9B.

In addition, the semiconductor device SM2 includes a plurality of gate electrodes GE2 Each of the gate electrodes GE2 extends in the first direction. In addition, each of the gate electrodes GE2 is arranged in the second direction so as to be separated from each other. One end of each gate electrode GE2 is connected to the gate interconnect GL2 extending in the second direction. For this reason, the plurality of gate electrodes GE2 and the gate interconnect GL2 form a comb-teeth shape. One end of the gate interconnect GL2 is connected to a gate pad GP2. Each of the gate electrodes GE2 is connected to the control circuit CT1 through the gate pad GP2.

As shown in FIGS. 10 and 11, the gate interconnect GL1 and the gate interconnect GL2 are disposed on, for example, the element isolation film EL1. In the present embodiment, the gate interconnect GL1 and the gate interconnect GL2 are formed on the element isolation film EL1 through an insulating film IF3 which is formed by the same process as that of forming the gate insulating film GI1 and the gate insulating film GI2. In addition, the upper surfaces and the lateral sides of the gate interconnect GL1 and the gate interconnect GL2 are covered by, for example, an insulating film IF1.

The semiconductor device SM2 includes a plurality of source electrodes SE1. Each of the source electrodes SE1 extends in the first direction. In addition, each of the source electrodes SE1 is arranged in the second direction so as to be separated from each other. One end of each source electrode SE1 is connected to a source pad SP1. For example, the source electrode SE1 and the source pad SP1 may be formed so that the plurality of source electrodes SE1 and the source pad SP1 form a comb-teeth shape integrally.

In addition, the semiconductor device SM2 includes a plurality of drain electrodes DE1. Each of the drain electrodes DE1 extends in the first direction. In addition, each of the drain electrodes DE1 is arranged in the second direction so as to be separated from each other. One end of each drain electrode DE1 is connected to a drain pad DP1. For example, the drain electrode DE1 and the drain pad PD1 may be formed so that the plurality of drain electrodes DE1 and the drain pad DP1 form a comb-teeth shape integrally.

Meanwhile, the plurality of source electrodes SE1 and the plurality of drain electrodes DE1 are formed, for example, so that the source electrode SE1 and the drain electrode DE1 are alternately arranged. In addition, the gate electrode GE1 is disposed, for example, between the source electrode SE1 and the drain electrode DE1. In this case, the transistor HT1 is formed by the source electrode SE1 and the drain electrode DE1 adjacent to each other and the gate electrode GE1 disposed therebetween. Meanwhile, the drain pad DP1 is provided, for example, so as to be located on the side opposite to the source pad SP1 when seen from a region in which the source electrode SE1 and the drain electrode DE1 are arranged.

The semiconductor device SM2 includes a plurality of source electrodes SE2. Each of the source electrodes SE2 extends in the first direction. In addition, each of the source electrodes SE2 is arranged in the second direction so as to be separated from each other. One end of each source electrode SE2 is connected to a source pad SP2 For example, the source electrode SE2 and the source pad SP2 may be formed so that the plurality of source electrodes SE2 and the source pad SP2 form a comb-teeth shape integrally.

In addition, the semiconductor device SM2 includes a plurality of drain electrodes DE2. Each of the drain electrodes DE2 extends in the first direction. In addition, each of the drain electrodes DE2 is arranged in the second direction so as to be separated from each other. One end of each drain electrode DE2 is connected to a drain pad DP2. For example, the drain electrode DE2 and the drain pad DP2 may be formed so that the plurality of drain electrodes DE2 and the drain pad DP2 form a comb-teeth shape integrally. In addition, the drain pad DP2 may be formed integrally with the source pad SP1.

Meanwhile, the plurality of source electrodes SE2 and the plurality of drain electrodes DE2 are formed, for example, so that the source electrode SE2 and the drain electrode DE2 are alternately arranged. In addition, the gate electrode GE2 is disposed, for example, between the source electrode SE2 and the drain electrode DE2. In this case, the transistor LT1 is formed by the source electrode SE2 and the drain electrode DE2 adjacent to each other and the gate electrode GE2 disposed therebetween. Meanwhile, the drain pad DP2 is provided, for example, so as to be located on the side opposite to the source pad SP2 from a region in which the source electrode SE2 and the drain electrode DE2 are arranged.

As shown in FIG. 10, the source electrode SE1 is provided, for example, on the compound semiconductor layer CL2 and on the gate interconnect GL1. At this time, the source electrode SE1 is provided on the gate interconnect GL1 through the insulating film IF1. In addition, the source electrode SE1 is electrically isolated from the drain pad DP1 by an insulating film IF2. The source electrode SE2 is provided, for example, on the compound semiconductor layer CL2 and on the gate interconnect GL2. At this time, the source electrode SE2 is provided on the gate interconnect GL2 through the insulating film IF1. In addition, the source electrode SE2 is electrically isolated from the drain pad DP2 by the insulating film IF2.

As shown in FIG. 11, the drain electrode DE1 and the drain electrode DE2 are formed on the compound semiconductor layer CL2. In addition, the drain electrode DE1 and the drain electrode DE2 are electrically isolated from the gate interconnect GL1 and the gate interconnect GL2, respectively, by the insulating film IF1.

Figure 12:
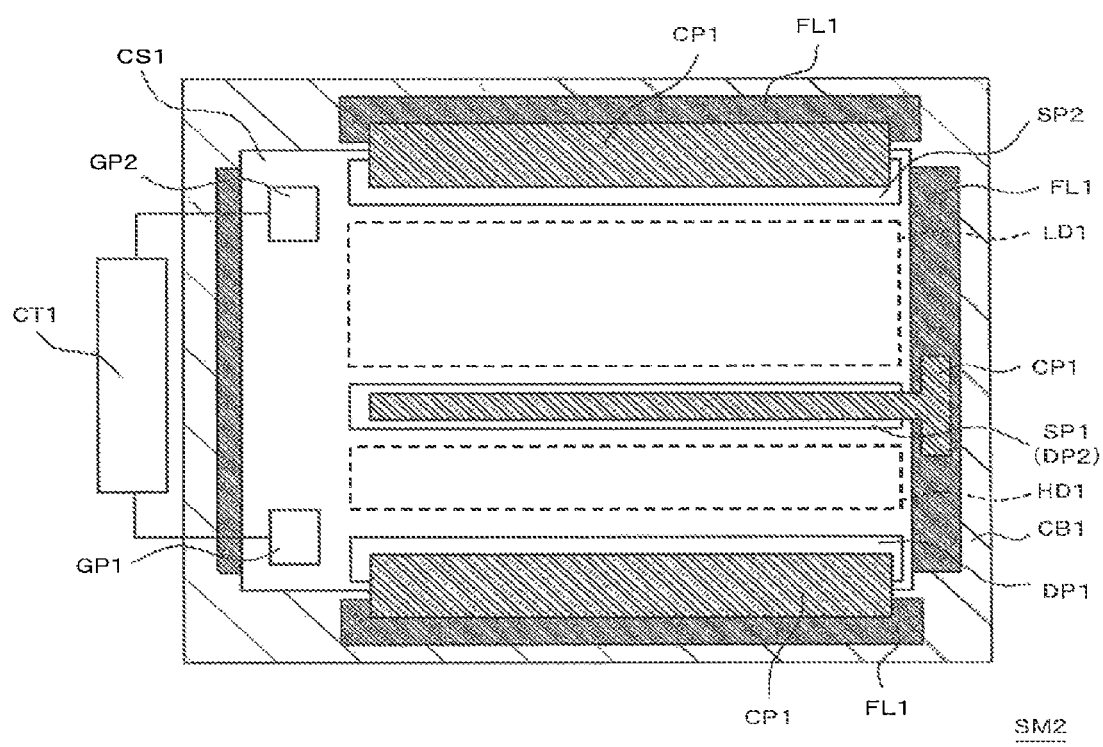
FIG. 12 is a plan view illustrating the semiconductor device shown in FIG. 8.
Figure 13:
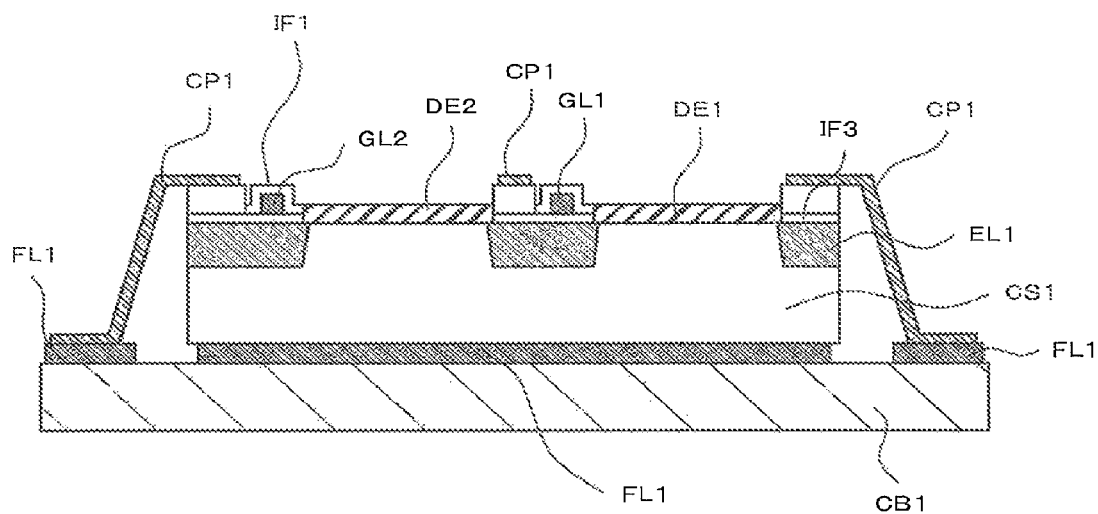
FIG. 13 is a cross-sectional view illustrating the semiconductor device shown in FIG. 12.

FIG. 12 is a plan view illustrating the semiconductor device SM2 shown in FIG. 8, and illustrates a state where the compound semiconductor substrate CS1 is mounted on the substrate CB1. FIG. 13 is a cross-sectional view illustrating the semiconductor device SM2 shown in FIG. 12.

In the example shown in FIGS. 12 and 13, the semiconductor device SM2 is configured such that the compound semiconductor substrate CS1 having the high-side switching device HD1 and the low-side switching device LD1 formed therein is mounted on the substrate CB1. Meanwhile, the substrate CB1 is, for example, an interconnect substrate such as an interposer or a motherboard.

In the present embodiment, the high-side switching device HD1 and the low-side switching device LD1, and the source pad SP1, the source pad SP2, the drain pad DP1, the drain pad DP2, the gate pad GP1, and the gate pad GP2 are formed, for example, on the compound semiconductor substrate CS1. The gate pad GP1 and the gate pad GP2 are connected to the substrate CB1 by, for example, a wire bonding.

Meanwhile, in FIG. 12, the gate interconnect GL1, the gate interconnect GL2, the gate electrode GE1, the gate electrode GE2, the source electrode SE1, the drain electrode DE1, the source electrode SE2, and the drain electrode DE2 are omitted.

A frame FL1 is formed on the substrate CB1. The compound semiconductor substrate CS1 is mounted on, for example, the frame FL1 formed on the substrate CB1. The source pad SP1, the source pad SP2, the drain pad DP1 and the drain pad DP2, and the frame FL1 are connected through, for example, a clip CP1. The clip CP1 is, for example, a copper plate clip. Each of the pads and the clip CP1 are bonded to each other by, for example, a solder.

In the present embodiment, as mentioned above, the clip CP1 is used for the connection of the substrate CB1 to the high-side switching device HD1 and the low-side switching device LD1. For this reason, it is possible to reduce inductance and to obtain a semiconductor device excellent in a high frequency operation.

A semiconductor package is obtained by sealing the frame FL1, the clip CP1, the compound semiconductor substrate CS1 and the like, provided on the substrate CB1, using a sealing resin.

In the present embodiment, the high-side switching device HD1 and the low-side switching device LD1 are formed within, for example, one semiconductor chip. Thereby, it is possible to achieve a reduction in the size of a semiconductor device. Meanwhile, the high-side switching device HD1 and the low-side switching device LD1 may be formed within semiconductor chips different from each other.

The control circuit CT1 is formed within, for example, a semiconductor chip (hereinafter, also referred to as a second semiconductor chip) different from a semiconductor chip (hereinafter, also referred to as a first semiconductor chip) including the high-side switching device HD1 and the low-side switching device LD1.

The second semiconductor chip is mounted on, for example, the same substrate CB1 as the first semiconductor chip. In this case, the first semiconductor chip and the second semiconductor chip are all sealed by a sealing resin and constitute one semiconductor package. Thereby, it is possible to achieve a reduction in the size of a semiconductor device.

Meanwhile, the second semiconductor chip may be mounted on a substrate different from the substrate CB1 on which the first semiconductor chip is mounted.

In the present embodiment, it is possible to obtain the same effect as in the first embodiment.

As stated above, while the invention devised by the inventor has been described specifically based on the embodiments thereof, the present invention is not limited to the above-mentioned embodiments, but it goes without saying that various changes and modifications may be made without departing from the scope of the invention.

It is apparent that the present invention is not limited to the above embodiment, and may be modified and changed without departing from the scope and spirit of the invention.

What is claimed is:

1. A semiconductor device including a DC/DC converter circuit, the semiconductor device comprising:
    a substrate;
    first, second, and third frames formed over the substrate;
    a compound semiconductor substrate formed over the substrate;
    a first transistor constituting a part of the DC/DC converter circuit and formed over the compound semiconductor substrate; and
    a second transistor constituting another part of the DC/DC converter circuit and formed over the compound semiconductor substrate,
    wherein the first transistor includes a first gate electrode, a first gate insulating film, a first source electrode, and a first drain electrode and is arranged between a first pad and a second pad in plan view,
    wherein the second transistor includes a second gate electrode, a second gate insulating film, a second source electrode, and a second drain electrode and is arranged between the second pad and a third pad in plan view,
    wherein the first drain electrode is connected to the first pad,
    wherein the first source electrode and the second drain electrode are connected to the second pad,
    wherein the second source electrode is connected to the third pad,
    wherein the first pad is connected to the first frame through a first clip,
    wherein the second pad is connected to the second frame through a second clip, and
    wherein the third pad is connected to the third frame through a third clip.

2. The semiconductor device according to claim 1, wherein the compound semiconductor substrate has a GaN layer and an AlGaN layer over the GaN layer.

3. The semiconductor device according to claim 2, wherein a part of the first gate electrode is disposed within a recess in the compound semiconductor substrate, and wherein the second gate electrode has a planar gate structure.

4. The semiconductor device according to claim 3, wherein the first transistor is a normally-off type transistor, and wherein the second transistor is a normally-on type transistor.

5. The semiconductor device according to claim 2, wherein each of the first, second, and third clips includes copper.

6. The semiconductor device according to claim 5, wherein the first, second, and third pads are bonded by solder to the first, second, and third clips, respectively.

* * * * *